(12) United States Patent
Lin et al.

(10) Patent No.: US 7,829,248 B2
(45) Date of Patent: Nov. 9, 2010

(54) PELLICLE STRESS RELIEF

(75) Inventors: Burn Jeng Lin, Hsin-Chu (TW);
Hsin-Chang Lee, Hsin-Chu Xian (TW);
Ming-Jiun Yao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 12/029,275

(22) Filed: Feb. 11, 2008

(65) Prior Publication Data
US 2009/0029268 A1 Jan. 29, 2009

Related U.S. Application Data

(60) Provisional application No. 60/951,598, filed on Jul. 24, 2007.

(51) Int. Cl.
*G03F 1/00* (2006.01)
(52) U.S. Cl. .............................. 430/5; 430/319; 430/311
(58) Field of Classification Search .................. 430/5, 430/319; 355/75
See application file for complete search history.

(56) References Cited

U.S. PATENT DOCUMENTS

| 4,255,216 | A | 3/1981 | Conant et al. | |
| 6,639,650 | B2 | 10/2003 | Shirasaki | |
| 6,795,170 | B2 * | 9/2004 | Mishiro et al. | 355/75 |
| 6,911,283 | B1 * | 6/2005 | Gordon et al. | 430/5 |
| 7,531,275 | B2 * | 5/2009 | Zhang et al. | 430/5 |
| 2002/0007907 | A1 * | 1/2002 | Arishima et al. | 156/272.2 |
| 2004/0043309 | A1 * | 3/2004 | Lin | 430/22 |
| 2007/0052945 | A1 * | 3/2007 | Loos et al. | 355/75 |

OTHER PUBLICATIONS

Chinese Patent Office, Office Action issued Jun. 3, 2010, Application No. 200810135751.9, 4 pages.

* cited by examiner

*Primary Examiner*—Stephen Rosasco
*Assistant Examiner*—Rashid Alam
(74) *Attorney, Agent, or Firm*—Haynes and Boone, LLP

(57) ABSTRACT

The present disclosure provides a mask-pellicle system for lithography patterning. The mask-pellicle system includes a mask substrate; a predefined pattern formed on the transparent pattern; a pellicle configured approximate the transparent substrate; a pellicle frame designed to secure the pellicle; and a stress-absorbing feature configured between the pellicle frame and the mask substrate, to reduce stress of the mask substrate.

20 Claims, 6 Drawing Sheets

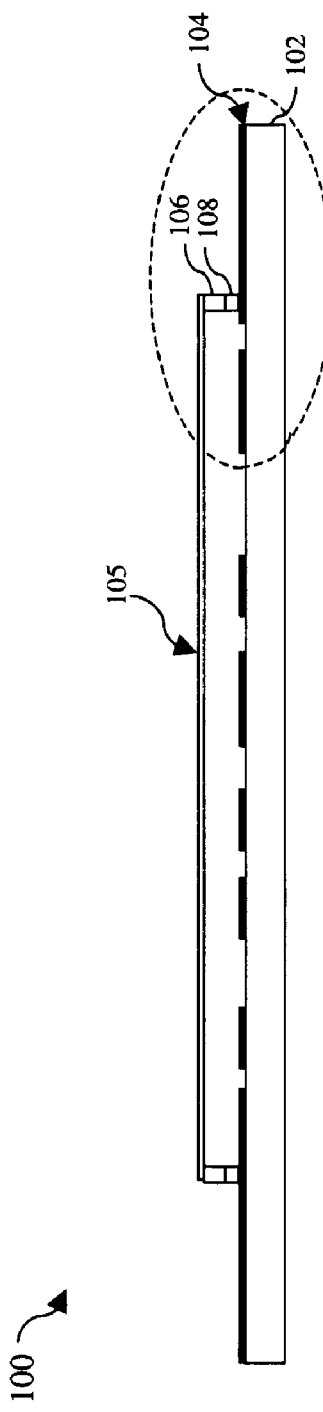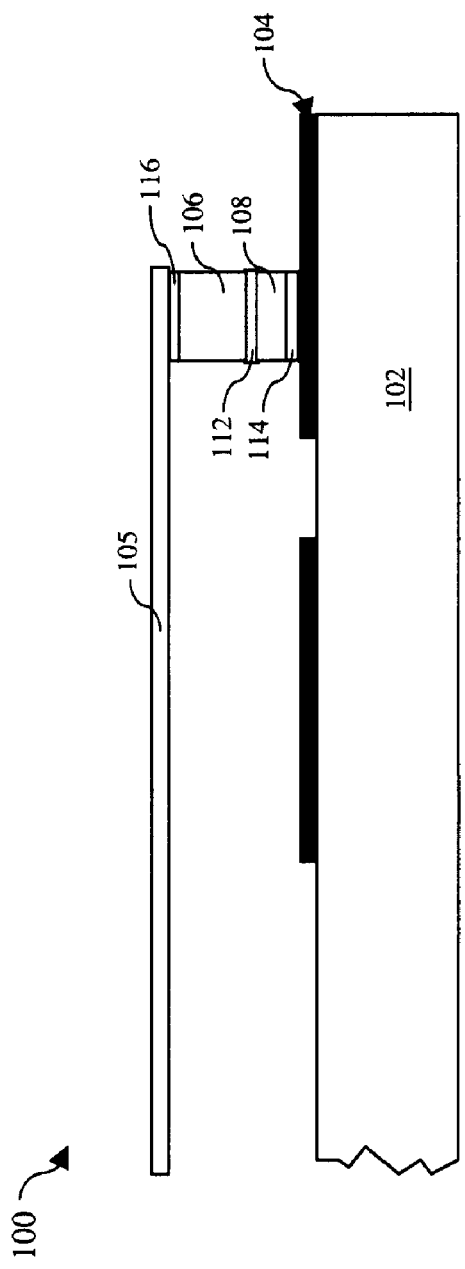
Fig. 1a
Fig. 1b

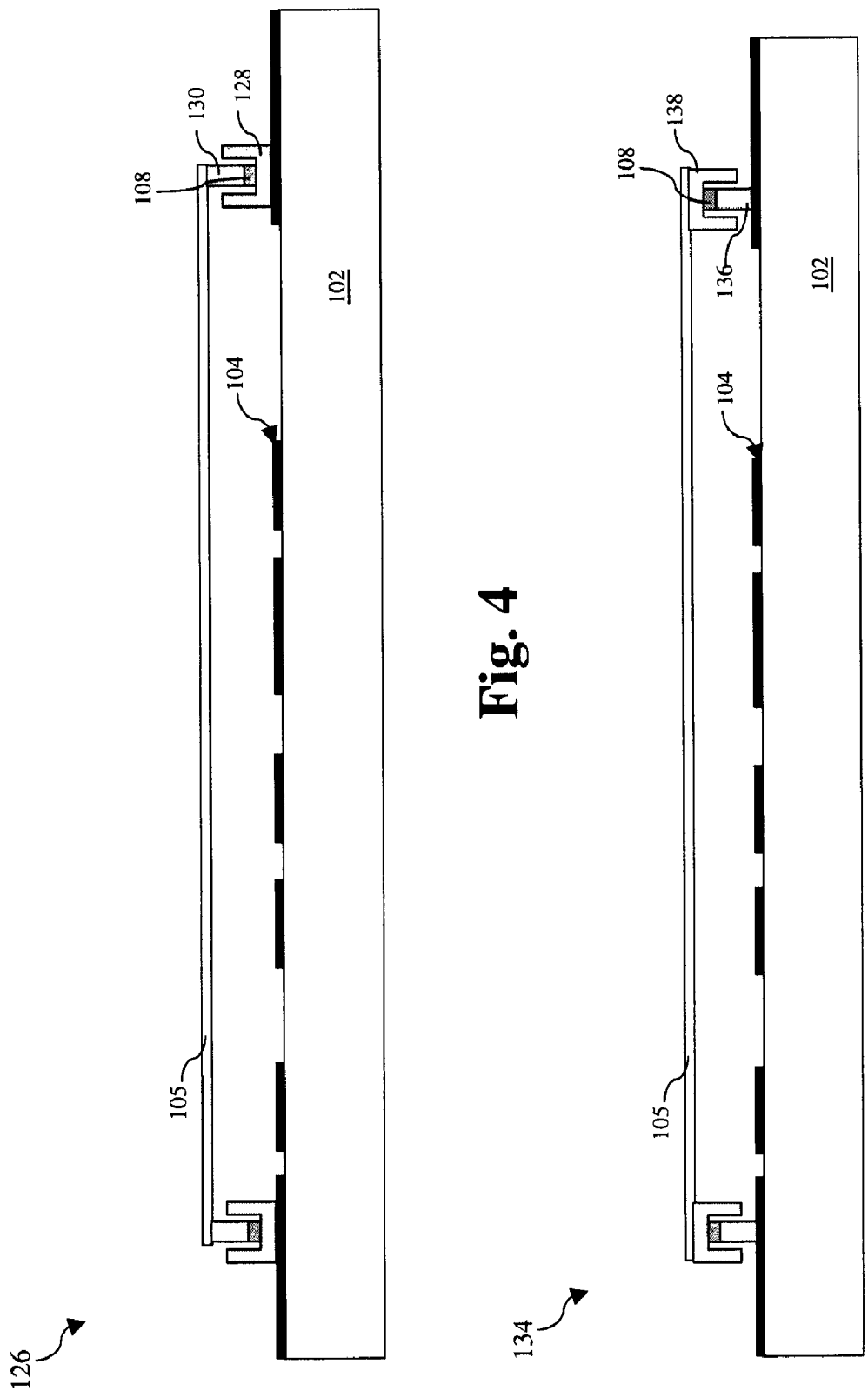

PELLICLE STRESS RELIEF

CROSS REFERENCE

This application claims the benefit of U.S. Provisional Application 60/951,598 entitled "Pellicle Stress Relief," filed Jul. 24, 2007, herein incorporated by reference in its entirety.

BACKGROUND

Optical projection lithography is a process by which an image on a mask is transferred to a substrate. A mask is typically included with a frame and a pellicle, collectively referred to as a mask system. The frame holds the mask and the pellicle is a transparent thin film that is mounted over the frame. The pellicle protects the mask from fallen particles and keeps the particles out of focus so that they do not produce an image, which may cause defects when the mask is being used. The pellicle is typically stretched and mounted over the frame and is attached to the frame by glue or other adhesive. The pellicle has become an indispensable component in optical projection lithography because of its defect prevention properties. As optical projection printing moves from imaging minimum feature sizes in the order of micrometers to the order of 50 nm and below, overlay accuracy between masking layers is pushed to 10 nm and smaller at the wafer level. Recently, experiments show that the stress due to pellicle mounting can contribute between 10 and 32 nm of inconsistent lateral pattern positioning at the mask. After a 4× reduction, the overlay accuracy has a pellicle-mounting component in the range of 2.5~8 nm, which is undesirable. Therefore, what is needed is a system and method to reduce such overlay error.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1a and 1b are sectional views of one embodiment of a mask-pellicle system with a stress-absorbing feature constructed according to aspects of the present disclosure.

FIG. 4 is a sectional view of one embodiment of a mask-pellicle system with a padding feature using a lower pellicle frame with a light shield structure to protect the padding feature from radiation.

FIG. 5 is a sectional view of one embodiment of a mask-pellicle system with a padding feature using an upper pellicle frame with a radiation shielding structure to protect the padding feature from radiation.

DETAILED DESCRIPTION

Figure 2:
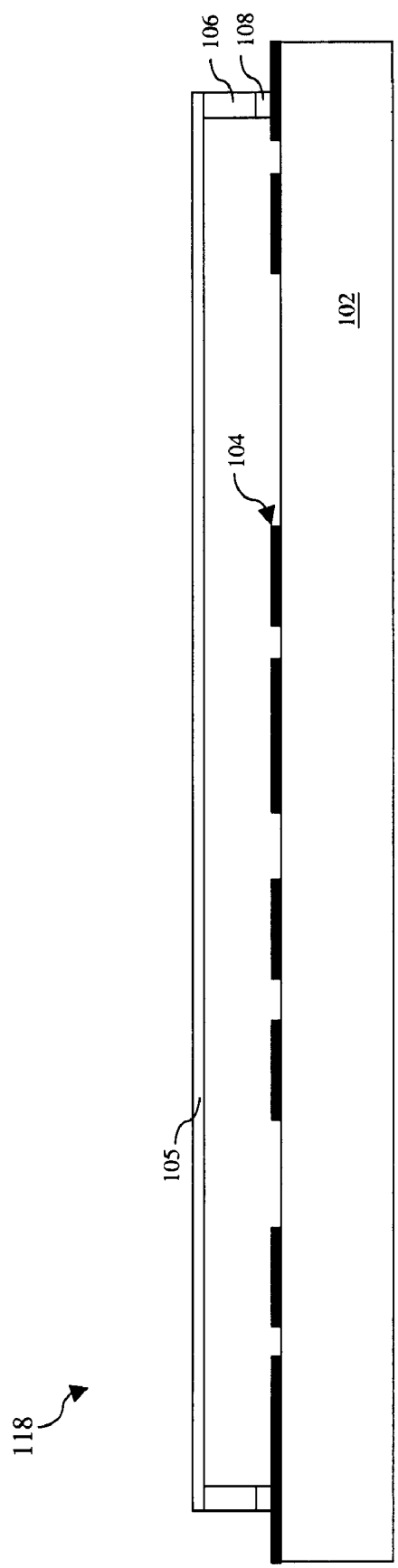
FIG. 2 is a sectional view of one embodiment of a mask-pellicle system with a padding feature under a pellicle frame to relieve stress.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1a is a sectional view of one embodiment of a mask-pellicle system 100 with a stress-absorbing feature constructed according to aspects of the present disclosure. FIG. 1b illustrates a portion of the mask-pellicle system 100 of FIG. 1a in a sectional view with more features. Referring to FIGS. 1a and 1b, the mask-pellicle system 100 and a method of using the same are described.

The system 100 includes a photomask (mask, or reticle, collectively referred to as mask) having a mask substrate 102 and a mask pattern 104 formed on the mask substrate 102. The mask may be utilized in manufacturing a semiconductor wafer. The mask substrate 102 may be a transparent substrate such as fused silica ($SiO_2$) relatively free of defects, glass, calcium fluoride, or other suitable material.

The mask pattern 104 formed on the mask substrate 102 may include features (or absorbers), designed to attenuate and/or provide a phase shift to a radiation beam (or radiation energy) used to fabricate a semiconductor wafer during a lithography patterning process. In one example, the mask pattern 104 includes chromium. In various other embodiments, the mask pattern 104 includes metal silicide such as MoSi or $TaSi_2$, metal nitride, iron oxide, inorganic material, other materials such as Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, $Al_2O_3R$, or combinations thereof. The method of forming the mask pattern on the mask substrate may include chemical vapor deposition (CVD), physical vapor deposition (PVD), atomic layer deposition (ALD), plating, and/or other suitable processes. The mask pattern 104 may alternatively or collectively include phase shift features formed with an attenuating material or other transmitting material with a different thickness and or a different optical phase shift. The radiation energy, used on the mask-pellicle system 100 to form an integrated circuit pattern on a semiconductor wafer during a photolithography process, may be ultraviolet and/or can be extended to include other radiation beams such as deep ultraviolet (DUV), and other proper radiation energy.

The mask-pellicle system 100 includes a pellicle 105 configured proximate the mask substrate 104. The pellicle 105 is a membrane made of a thin film transparent to the radiation beam used in a lithography patterning process. The pellicle is configured proximate the patterned side of the mask substrate 102 such that the mask pattern 104 is between the pellicle 105 and the mask substrate 102 as illustrated in FIGS. 1a and 1b.

The mask-pellicle system 100 includes a pellicle frame 106 configured such that the pellicle 105 can be attached and secured to the pellicle frame. The pellicle frame 106 includes a material with mechanical strength and designed in a shape, dimensions, and a configuration such that to secure the pellicle properly. For example, the pellicle frame 106 includes aluminum. The pellicle frame 106 may include one piece or two components as illustrated and described later in various embodiments.

The mask-pellicle system 100 includes a stress-absorbing feature 108 positioned between the pellicle frame 106 and the mask substrate 102. The stress-absorbing feature 108 is designed and configured to be capable of releasing stress of the mask substrate 102 caused by the assembling of the mask-pellicle system 100 or other source of stress. The stress from the assembling or other factors can be reduced or eliminated from being transferred to the mask substrate 102. In one embodiment, the stress-absorbing feature 108 is a soft padding feature. In various embodiments, the soft padding 108 includes a polymer material, a sponge-like material, a foam material, or a combination thereof. The stress-absorbing feature 108 is glued, on one side, to the pellicle frame 106 by an adhesive layer 112 as illustrated in FIG. 1b. Therefore, the stress-absorbing feature 108 is separated from the pellicle frame 106 by the adhesion layer 112 interposed between. The stress-absorbing feature 108 may also be glued, from a second side, to the mask substrate 102 by a second adhesive layer 114. Therefore, the stress-absorbing feature 108 is separated from the mask substrate 102 by the second adhesion layer 114 interposed between. In one configuration, the stress-absorbing feature 108 is configured to overlie on one absorber of the mask pattern 104, such as overlie on a chromium absorber, so that the radiation energy from the backside of the mask substrate 102 during a lithography process is blocked from being directed toward the stress-absorbing feature 108. In one embodiment, the stress-absorbing feature 108 is immune to the radiation energy used in a lithography process, and thus is not degradable during the lithography patterning processes. In one example, the stress-absorbing feature includes a silicone material. In one embodiment, the stress-absorbing feature 108 is also adhesive to the pellicle frame 106 and the mask absorber 104/substrate 102, serving the duties of adhesive layer 112, stress-absorbing feature 108, and second adhesive layer 114.

The mask-pellicle system 100 further include another adhesive layer 116 interposed between the pellicle 105 and the pellicle frame 106 to bond the both together, as illustrated in FIG. 1b. When assembling a mask-pellicle system, the flatness of the pellicle frame and the flatness of a pellicle pusher used in the assembling are relevant parameters. The stress can be introduced to the mask substrate during assembly and causes the overlay error when such mask-pellicle system is used in a lithography patterning process. The disclosed mask-pellicle system 100 includes the stress-absorbing feature 108. The stress caused during the assembling or other sources can be relieved by the stress-absorbing feature in the mask-pellicle system 100. The overlay error during a lithography process utilizing the mask-pellicle system 100 can be reduced or eliminated.

The pellicle frame 106 may be designed in various dimensions, shapes and configurations to protect the stress-absorbing feature 108 from being exposed to the radiation energy during the lithography processing, as exemplified in various embodiments of FIG. 2 through 9. Among those and other alternatives, the pellicle frame 106 may have two components. As such, the stress-absorbing feature 108 is also glued, from the second side, to the second component of the pellicle frame 106 by an adhesive layer. The stress-absorbing feature may also utilize a structure with a mechanism to relieve the stress such as one illustrated in FIG. 10.

FIGS. 2 through 10 provide several embodiments of the mask-pellicle system with the stress-absorbing feature and the pellicle frame constructed according to aspects of the present disclosure. As described above, various adhesive layers may be present and interposed between various components, such as the adhesive layers 112, 114 and/or 116 illustrated in FIG. 1b. However, adhesive layers are not shown for the sake of clarity. The descriptions for those similar elements such as the mask substrate 102, the mask pattern 104, and the pellicle 105 are also eliminated below for the sake of clarity.

FIG. 2 is a sectional view of one embodiment of a mask-pellicle system 118 with a padding feature 108 under a pellicle frame 106 designed to relieve stress. The padding feature 108 and the pellicle frame 106 are designed to have substantially same geometrical shape and dimensions when viewed in a direction perpendicular to the mask substrate 102. In addition, the pellicle frame 106 is configured to overlie and sit fully on the padding feature 108.

Figure 3:
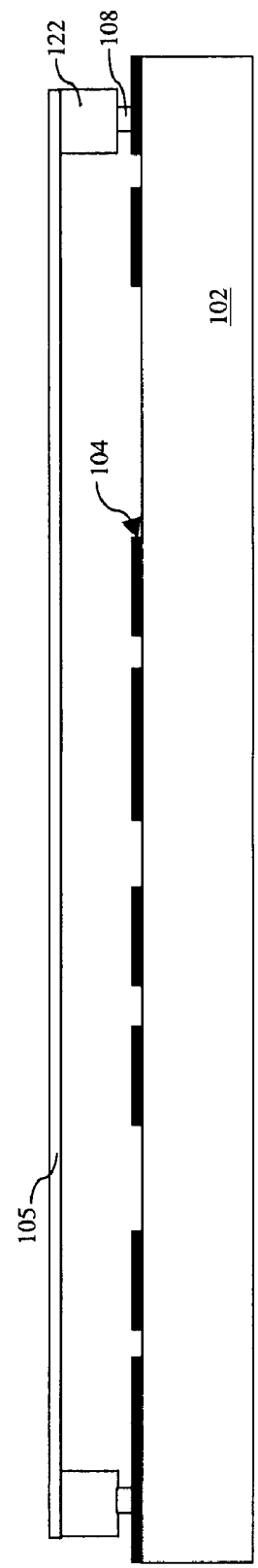
FIG. 3 is a sectional view of one embodiment of a mask-pellicle system with a widened pellicle frame to protect a padding feature under the pellicle frame from radiation.

FIG. 3 is a sectional view of one embodiment of a mask-pellicle system 120 with a widened pellicle frame 122 to protect a padding feature 108 under the pellicle frame from the radiation energy. In addition, the padding feature 108 is interposed between the widened pellicle frame 122 and the opaque absorber of the mask pattern 104, and is thus protected by both from the radiation energy.

FIG. 4 is a sectional view of one embodiment of a mask-pellicle system 126 having a padding feature and a lower pellicle frame with a radiation (e.g., light) shielding structure to protect the padding feature from the radiation energy. In the mask-pellicle system 126, the pellicle frame includes two components as a lower pellicle frame 128 and an upper pellicle frame 130. The lower pellicle frame 128 is designed to have a side structure capable of shielding the padding feature 108 from the radiation energy. The padding feature 108 is interposed between the upper pellicle frame 130 and the lower pellicle frame 128. The padding feature 108 is protected by the radiation shielding structure of the lower pellicle frame 128 in such a configuration from the radiation energy when the mask-pellicle system 126 is used in a lithography process.

FIG. 5 is a sectional view of one embodiment of a mask-pellicle system 134 with the padding feature 108 interposed between a lower pellicle frame component 136 and an upper pellicle frame component 138. The upper pellicle frame component 138 has a side structure designed to shield the padding feature from the radiation energy. The mask-pellicle system 134 is similar to that of FIG. 4 but its lower pellicle frame is designed with a shielding feature and a shielding function.

Figure 6:
FIG. 6 is a sectional view of one embodiment of a mask-pellicle system with a padding feature and an L-shaped pellicle frame configured to protect the padding feature from radiation.

FIG. 6 is a sectional view of one embodiment of a mask-pellicle system 142 with a padding feature and an L-shaped pellicle frame 144 configured to protect the padding feature from the radiation energy. The L-shaped pellicle frame 144 is configured to overlie on the padding feature 108. The L-shaped pellicle frame 144 may have a widened surface (relative to the padding feature) to protect the padding feature from the radiation energy.

Figure 7:
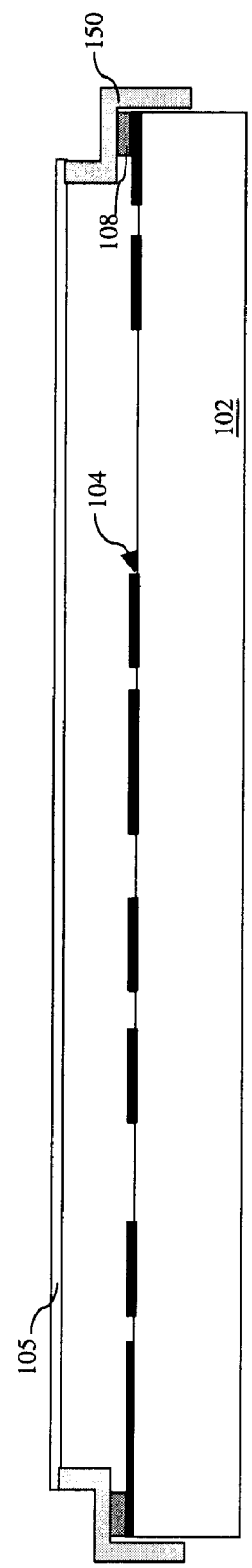
FIG. 7 is a sectional view of one embodiment of a mask-pellicle system with a padding feature and an extended pellicle frame to protect the padding feature from radiation sideways.

FIG. 7 is a sectional view of one embodiment of a mask-pellicle system 148 with a padding feature 108 and an extended pellicle frame 150 to protect the padding feature from radiation sideways. The extended pellicle frame 150 includes an extended portion, as illustrated in FIG. 7, being capable of shielding the padding feature 108 from the radiation energy during a lithography process.

Figure 8:
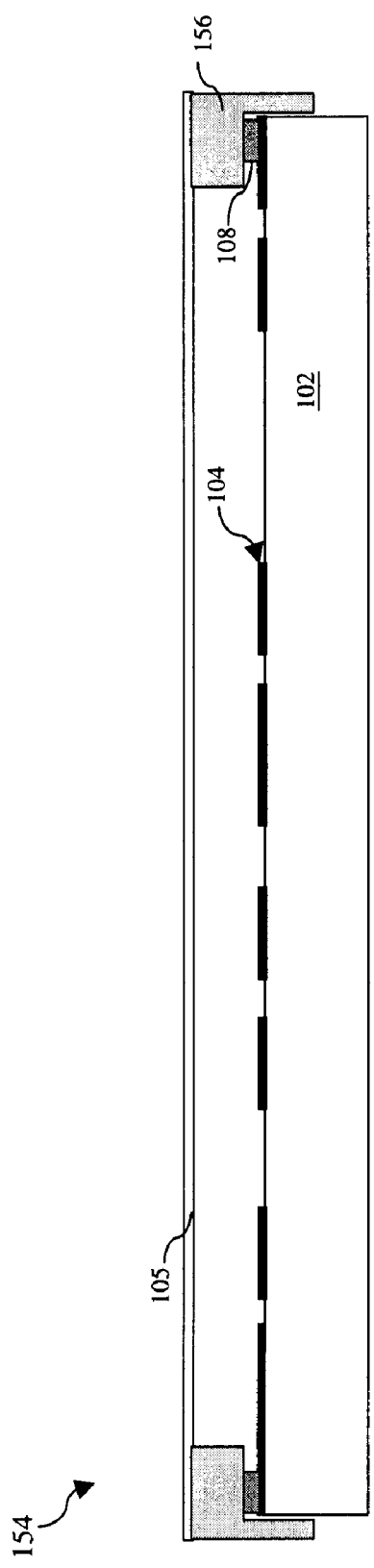
FIG. 8 is a sectional view of one embodiment of a mask-pellicle system with a padding feature and a simple pellicle frame to protect the padding feature from radiation.

FIG. 8 is a sectional view of one embodiment of a mask-pellicle system 154 with a padding feature 108 and a simpler pellicle frame 156 to protect the padding feature from the radiation energy. The simpler pellicle frame 156 may have a widened surface (relative to the padding feature) to overlie the padding feature 108 and protect the padding feature from the radiation energy. The simpler pellicle frame 156 further includes an extended portion to protect the padding feature 108 from the radiation energy sideways during a lithography process.

Figure 9:
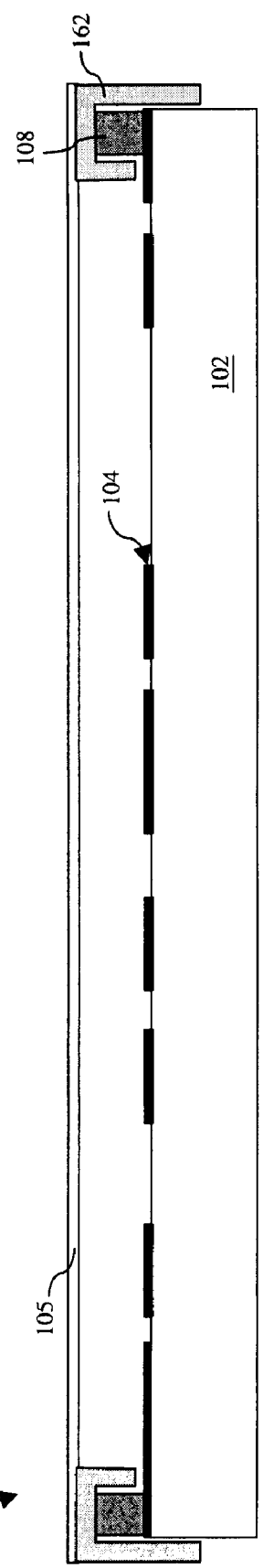
FIG. 9 is a sectional view of one embodiment of a mask-pellicle system with a padding feature and a pellicle frame designed to protect the both sides of the padding feature from radiation.

FIG. 9 is a sectional view of one embodiment of a mask-pellicle system 160 with a padding feature 108 and a pellicle frame 162 designed to protect the both sides of the padding feature from the radiation energy. The pellicle frame 162 includes an asymmetric side structure capable of shielding the padding feature 108 from the radiation energy during a lithography process.

Figure 10:
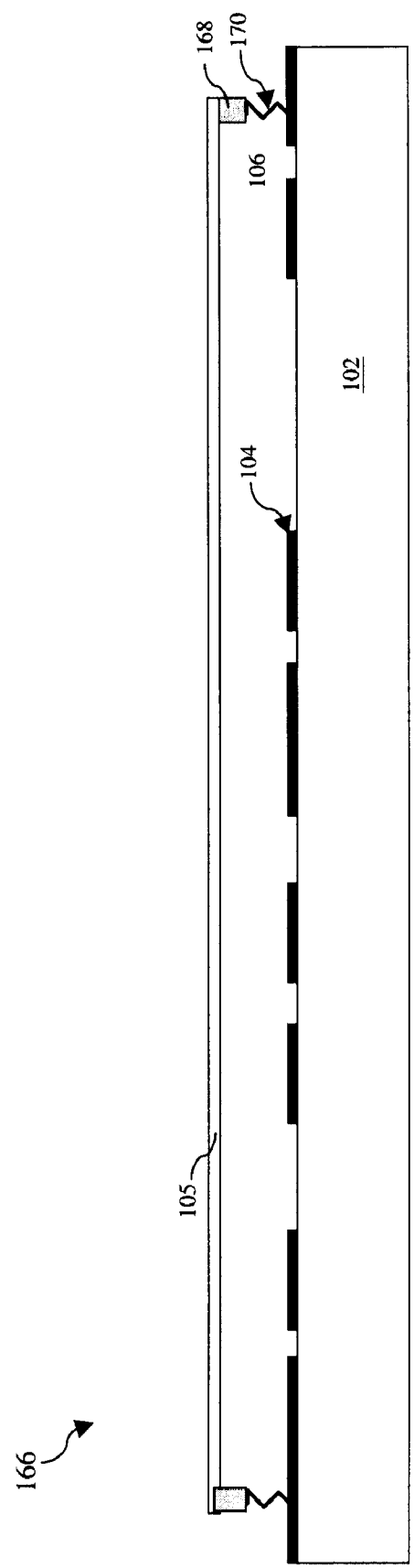
FIG. 10 is a sectional view of one embodiment of a mask-pellicle system with an accordion-type support.

In another embodiment, the stress-absorbing feature 108 utilizes a structure designed with a mechanism to relieve stress, as exemplified in FIG. 10. Such a stress-absorbing feature may include a metal material, which is immune to the radiation energy of the lithography processing. FIG. 10 illustrates a mask-pellicle system 166, in a sectional view, with a pellicle frame 168 and an accordion-type support 170 as the stress-absorbing feature for stress releasing. The accordion-type support 170 includes an accordion type structure capable of releasing the stress of the mask substrate 102, in a configuration as illustrated in FIG. 10. The accordion type support 170 may alternatively or collectively utilize other mechanism to release the stress.

During a lithography patterning process, a lithography apparatus such as a stepper or a scanner is utilized. A substrate such as a semiconductor wafer is provided to form an integrated circuit pattern thereon. The semiconductor wafer is further coated with a radiation-sensitive material layer such as a photoresist layer. A mask-pellicle system, such as disclosed from FIGS. 1a, 1b, and 2-10 in various embodiments, is used in the lithography apparatus to pattern the semiconductor wafer. The mask-pellicle system includes a mask pattern formed on the mask substrate and defined with an integrated circuit pattern to be imaged on the semiconductor wafer. The mask-pellicle system includes a pellicle configured on the mask to protect the mask. The mask-pellicle system includes a stress-absorbing feature interposed between the pellicle frame and the mask substrate. The stress-absorbing feature is designed with a mechanism to relieve the stress of the mask substrate caused from the assembling of the mask-pellicle system or other sources. The lithography patterning process forms the integrated circuit pattern defined on the mask to the semiconductor wafer. In one example, the photolithography process includes soft baking, mask aligning, exposing, post-exposure baking, developing photoresist, and hard baking. In the mask alignment step, an integrated circuit pattern (one masking layer or mask pattern) defined on the mask is overlaid to a previously exposed masking layer on the semiconductor wafer. Since the mask in the mask-pellicle system utilizes a stress-absorbing feature, the stress of the mask from the assembling or other sources is reduced. The mask pattern error from the deformation of mask introduced by mask stress is substantially reduced. The overlay error during the alignment step is also reduced. The improved lithography pattern with reduced overlay error is accomplished by the disclosed mask-pellicle system with the stress-absorbing feature.

The mask-pellicle system and processes making thereof, as described above, may have variations without departure from the spirit and the scope of the present disclosure. For example, the pellicle may be alternatively a thick plate transparent to the radiation beam. In another alternative, the soft padding material for the stress-absorbing feature is self-adhesive to the pellicle frame and/or the mask substrate. In such case, the adhesive layer(s) such as the adhesive layer to bond the stress-absorbing feature to the pellicle frame and/or mask substrate may be eliminated. The soft padding material may alternatively use another proper material that is capable of releasing stress and may be additionally immune to the radiation energy.

The mask-pellicle system may not only be used to fabricate a semiconductor wafer, but may be alternatively used to pattern other substrates such as a glass substrate used to form a thin film transistor liquid crystal display (TFT-LCD) substrate. The mask pattern may further utilize other lithography techniques such as chromeless phase shift features and optical proximity correction. For example, various assist features can be included in the mask pattern. In another embodiment, the mask may be covered and protected by pellicles from the both sides. Each pellicle is attached to the mask through a stress-absorbing feature to relieve the stress of the mask. In another example, the pellicle frame used in the mask-pellicle system may include more than two components. In one example, the soft padding material is immune to the radiation energy includes being immune to ultraviolet (UV) radiation in the range between about 450 nm and 150 nm.

Thus the present disclosure provides a mask-pellicle system for lithography patterning. In one embodiment, the mask includes a mask substrate; a predefined pattern formed on the transparent pattern; a pellicle configured approximate the transparent substrate; a pellicle frame designed to secure the pellicle; and a stress-absorbing feature configured between the pellicle frame and the mask substrate, to reduce stress of the mask substrate.

In other embodiments, the mask-pellicle system may further include an adhesive layer interposed between the stress-absorbing feature and the pellicle frame, bonding the stress-absorbing feature and the pellicle frame together. The system may further include another adhesive layer interposed between the stress-absorbing feature and the mask substrate, bonding the stress-absorbing feature and the mask substrate together. The stress-absorbing feature may include a soft-padding material. The stress-absorbing feature may be self-adhesive to at least one of the pellicle frame and the mask substrate. The stress-absorbing feature may include a material selected from the group consisting of a rubber compound, a polymer, a sponge-like material, a foam material, and combinations thereof. In one example, the stress-absorbing feature may include silicone. The stress-absorbing feature is immune to radiation energy used during a lithography process. The stress-absorbing feature may include an accordion-type pellicle support. The accordion-type pellicle support may include metal. The stress-absorbing feature may have a substantially same section area of the pellicle frame and is positioned substantially on the pellicle frame when viewed from a direction perpendicular to the mask substrate. The pellicle frame may be designed and configured to shield the stress-absorbing feature from radiation energy used during a lithography process. The pellicle frame may be wider than the stress-absorbing feature when viewed in a direction perpendicular to the mask substrate, to shield the stress-absorbing feature from the radiation energy. The pellicle frame may include an extended portion configured to protect the stress-absorbing feature from the radiation energy. The pellicle frame may be designed to include a structure selected from the group consisting of an L-shaped feature, a side structure, an asymmetric side structure, and a combination thereof. The pellicle frame may include an upper pellicle frame component and a lower pellicle frame component. The stress-absorbing feature is be configured between the upper pellicle frame component and the lower pellicle frame component, at least one of the upper pellicle frame component and the lower pellicle frame component is designed to shield the stress-absorbing feature from the radiation energy.

The present disclosure also provides another embodiment of a mask-pellicle system for photolithography patterning. The system includes, a mask with a mask pattern defined thereon; a pellicle configured approximate the mask; a pellicle frame configured between the mask and the pellicle, holding the pellicle; and a stress-absorbing feature configured between the pellicle frame and the mask, attached to the pellicle frame, designed to reduce stress of the transparent substrate.

In various embodiments of the above mask-pellicle system, the mask pattern defined on the mask includes an opaque material feature. The stress-absorbing feature is further attached on the opaque material feature of the mask. The stress-absorbing feature may include a material selected from the group consisting of a rubber compound, a polymer, a sponge-like material, a foam material, and combinations thereof. The pellicle frame includes a shielding portion configured such that the stress-absorbing feature is protected from exposing light.

The present disclosure also provides a method of an integrated circuit fabrication. The method includes, providing a substrate with a radiation energy sensitive coating layer formed thereon; providing a mask-pellicle system; and forming an integrated circuit pattern on the substrate by utilizing the mask in a lithography process. In the disclosed method, the mask-pellicle system includes a mask with a pattern defined thereon; a pellicle configured approximate the mask; a pellicle frame configured between the mask and the pellicle, holding the pellicle; and a stress-absorbing feature configured between the pellicle frame and the mask, attached to the pellicle frame, designed to reduce stress of the mask.

In the disclosed method, the forming of the integrated circuit pattern may include performing an alignment step to overlay one masking layer to a previously exposed masking layer on the substrate.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A mask-pellicle system for lithography patterning, comprising:
    a transparent substrate;
    a predefined pattern formed on the transparent substrate;
    a pellicle;
    a pellicle frame to secure the pellicle; and
    a stress-absorbing feature attached to the pellicle frame and adhesively attached to the transparent substrate, and designed to reduce stress of the transparent substrate,
    wherein the pellicle frame includes two segments connected with an angle therebetween configured to substantially protect the stress-absorbing feature from radiation energy used during a lithography process.

2. The system of claim 1, further comprising a first adhesive layer interposed between the stress-absorbing feature and the pellicle frame, bonding the stress-absorbing feature and the pellicle frame together.

3. The system of claim 2, further comprising a second adhesive layer interposed between the stress-absorbing feature and the transparent substrate, bonding the stress-absorbing feature and the transparent substrate together.

4. The system of claim 1, wherein the stress-absorbing feature comprises a soft-padding material.

5. The system of claim 1, wherein the pellicle frame includes three segments connected such that adjacent segments are substantially perpendicular to each other.

6. The system of claim 1, wherein the stress-absorbing feature comprises a material selected from the group consisting of a rubber compound, a polymer, a sponge-like material, a foam material, and combinations thereof.

7. The system of claim 1, wherein the stress-absorbing feature comprises silicone.

8. A mask-pellicle system for photolithography patterning, comprising:
    a mask with a pattern defined thereon;
    a pellicle;
    a stress-absorbing feature configured between the pellicle and the mask designed to reduce a stress of the mask;
    a first pellicle frame configured between the mask and the stress-absorbing feature; and
    a second pellicle frame configured between the pellicle and the stress-absorbing feature.

9. The system of claim 1, wherein the stress-absorbing feature comprises an accordion-type pellicle support.

10. The system of claim 8, wherein the first and second pellicle frames are designed to protect a first surface and a second surface of the stress absorbing feature from radiation energy, the first surface being adjacent the first pellicle frame and the second surface being adjacent the second pellicle frame.

11. The system of claim 1, wherein the pellicle frame is designed to shield a first surface and a second surface of the stress-absorbing feature from radiation energy used during a lithography process, the first surface being adjacent the pellicle and the second surface being adjacent the transparent substrate.

12. The system of claim 11, wherein the pellicle frame includes three segments connected such that adjacent segments are substantially perpendicular to each other.

13. The system of claim 8, wherein at least one of the first and second pellicle frame comprises an extended portion configured to protect the stress-absorbing feature from the radiation energy.

14. The system of claim 11, wherein the pellicle frame is designed to include a structure selected from the group consisting of an L-shaped feature, a side structure, an asymmetric side structure, and a combination thereof.

15. The system of claim 8, wherein the stress-absorbing feature is immune to radiation energy used during a lithography process.

16. The system of claim 8, wherein the pattern defined on the mask comprises an opaque material feature.

17. The system of claim 8, wherein the stress-absorbing feature comprises a material selected from the group consisting of a rubber compound, a polymer, a sponge-like material, a foam material, and combinations thereof.

18. The system of claim 8, wherein at least one of the first and second pellicle frames includes a shielding portion configured such that the stress-absorbing feature is protected from exposing light.

19. A method of an integrated circuit fabrication, comprising:
- providing a substrate with a radiation energy sensitive coating layer formed thereon;
- providing a mask-pellicle system including
  - a mask with a pattern defined thereon;
  - a pellicle;
  - a pellicle frame configured between the mask and the pellicle, holding the pellicle; and
  - a stress-absorbing feature configured between the pellicle frame and the mask, adhesively attached to the mask, designed to reduce stress of the mask, wherein the pellicle frame includes three segments connected with an angle between adjacent segments, designed to shield the stress-absorbing feature from radiation energy used during a lithography process; and
- forming an integrated circuit pattern on the substrate by utilizing the mask in a lithography process.

20. The method of claim 19, wherein the forming of the integrated circuit pattern comprises performing an alignment step to overlay one masking layer to a previously exposed masking layer on the substrate.

* * * * *